United States Patent
Nagakura et al.

(10) Patent No.: US 8,194,066 B2
(45) Date of Patent: Jun. 5, 2012

(54) CROSS-SECTIONAL IMAGE DISPLAY APPARATUS, CROSS-SECTIONAL IMAGE DISPLAY METHOD, AND COMPUTER READABLE RECORDING MEDIUM STORING CROSS-SECTIONAL IMAGE DISPLAY PROGRAM

(75) Inventors: Takehiko Nagakura, Setagaya-ku (JP); Jun Oishi, Inzai (JP); Tadahiko Shiomi, Inzai (JP)

(73) Assignees: Takenaka Corporation, Osaka (JP); Takehiko Nagakura, Tokyo (JP)

( * ) Notice: Subject to any disclaimer, the term of this patent is extended or adjusted under 35 U.S.C. 154(b) by 786 days.

(21) Appl. No.: 11/989,291

(22) PCT Filed: Jul. 28, 2006

(86) PCT No.: PCT/JP2006/315017
§ 371 (c)(1),
(2), (4) Date: Feb. 11, 2009

(87) PCT Pub. No.: WO2007/013607
PCT Pub. Date: Feb. 1, 2007

(65) Prior Publication Data
US 2009/0174714 A1    Jul. 9, 2009

(30) Foreign Application Priority Data

Jul. 29, 2005   (JP) .................................. 2005-222150
Jul. 28, 2006   (JP) .................................. 2006-205563

(51) Int. Cl.
*G06T 15/10*   (2011.01)

(52) U.S. Cl. ....................................... 345/419; 345/427
(58) Field of Classification Search ................... 345/427
See application file for complete search history.

(56) References Cited

U.S. PATENT DOCUMENTS

| | | | | |
|---|---|---|---|---|
| 5,291,213 A | * | 3/1994 | Krauss | 345/179 |
| 5,563,631 A | * | 10/1996 | Masunaga | 345/169 |
| 6,252,599 B1 | * | 6/2001 | Natsuko et al. | 345/419 |
| 6,476,378 B2 | * | 11/2002 | Nougaret et al. | 250/227.11 |

FOREIGN PATENT DOCUMENTS

| | | |
|---|---|---|
| JP | A 05-314222 | 11/1993 |
| JP | A 2001-052038 | 2/2001 |
| JP | A 2002-342394 | 11/2002 |
| JP | A 2003-006674 | 1/2003 |

\* cited by examiner

*Primary Examiner* — Xiao Wu
*Assistant Examiner* — Yingchun He
(74) *Attorney, Agent, or Firm* — Oliff & Berridge, PLC (57) ABSTRACT

A cross-sectional image display apparatus, method, and program is capable of setting cross-sectional positions consecutively and efficiently. 3D image data is stored in a PC, a two-dimensional image of the 3D image is presented at a position detection surface of a tablet, the three-dimensional image is virtually constructed in a space above the position detection surface to have dimensions corresponding to the two-dimensional image and to be located at a position corresponding to the two-dimensional image. A plate-like display device designates the cross-sectional position at which the cross-sectional image is to be displayed in the constructed 3D image, the tablet detects the designated cross-sectional position, the PC converts the detected cross-sectional position into a cross-sectional position in a coordinate system of the 3D image and creates cross-sectional image data, and the display device uses the cross-sectional image data to display the cross-sectional image.

13 Claims, 8 Drawing Sheets

CROSS-SECTIONAL IMAGE DISPLAY APPARATUS, CROSS-SECTIONAL IMAGE DISPLAY METHOD, AND COMPUTER READABLE RECORDING MEDIUM STORING CROSS-SECTIONAL IMAGE DISPLAY PROGRAM

TECHNICAL FIELD

The present invention relates to a cross-sectional image display apparatus, a cross-sectional image display method, and a cross-sectional image display program, and more particularly to a cross-sectional image display apparatus, a cross-sectional image display method, and a cross-sectional image display program for displaying a cross-sectional image of a three-dimensional image based on three-dimensional data representing the three-dimensional image.

BACKGROUND ART

In recent years, as image processing and computer graphics technologies have developed, there has been increasing demand for the display of a cross-sectional image of a three-dimensional image in real-time. Such real-time image display is used, for example, when a presentation is given to a customer to display a building before, during and after construction or an automobile during the design phase, and when an explanation is given to a patient and his/her family by displaying the body of the patient in a medical clinic. The "cross-sectional image" used herein includes an image showing a cross section of a three-dimensional image by cutting the three-dimensional image along a cross-sectional cutting plane, a perspective image of the three-dimensional image when the cross-sectional cutting plane is set internally or externally to the three-dimensional image, and the combination of the perspective image and the image showing the cross section.

Patent Document 1 discloses an example of conventional art that may be applied to meet such demands, being an apparatus for drawing a cross-sectional view taken along a cutting line drawn in a plan view. The apparatus includes a storage unit for storing plan view information representing the plan view. The plan view information is read from the storage unit and the plan view is drawn based on the read plan view information. Then, the cross-sectional view is drawn based on intersection information regarding the intersections of the cutting line and other lines in the plan view and on height information regarding the height.

In this technology, by using the above plan view as the plan view of the three-dimensional image of the building, automobile, or patient's body described above and displaying the thus drawn cross-sectional view as an image, cross-sectional views of the three-dimensional images of these objects can be displayed.

Patent Document 1: Japanese Patent Application Laid-Open (JP-A) No. 2001-52038

DISCLOSURE OF THE INVENTION

Problems to be Solved by the Invention

Depending on the application in which a cross-sectional image is to be displayed, it is desirable to consecutively display cross-sectional images from plural locations. In this case, it is necessary to designate the cross-sectional positions from plural locations consecutively and efficiently.

On the other hand, in the technology disclosed in the Patent Document 1, the cross-sectional positions are designated by setting cutting lines in the plan view, which leads to in difficulties in setting the cross-sectional positions consecutively and efficiently.

The present invention has been made to solve the above problem. An object of the present invention is to provide a cross-sectional image display apparatus, a cross-sectional image display method, and a cross-sectional image display program capable of setting the cross-sectional positions consecutively and efficiently.

Means for Solving the Problems

To achieve the above object, the cross-sectional image display apparatus of claim 1 is a cross-sectional image display apparatus that displays a cross-sectional image of a three-dimensional image based on three-dimensional image data representing the three-dimensional image, including, a storage unit that pre-stores the three-dimensional image data; a display unit for displaying the cross-sectional image; a two-dimensional image presentation unit having a presentation surface that presents a two-dimensional image of the three-dimensional image; a designation unit for designating a cross-sectional position within the three-dimensional image for the cross-sectional image that is to be displayed, in a state in which the three-dimensional image is virtually constructed in a space above the presentation surface such that the constructed three-dimensional image has dimensions, and is located at a position, corresponding to the two-dimensional image presented at the presentation surface; a detection unit that detects the cross-sectional position designated by the designation unit; a conversion unit that converts the cross-sectional position detected by the detection unit into a cross-sectional position in a coordinate system of the three-dimensional image; a cross-sectional image creation unit that creates cross-sectional image data representing the cross-sectional image of the three-dimensional image at the cross-sectional position converted by the conversion unit based on the cross-sectional position and the three-dimensional image data; and a control unit that controls the display unit such that the cross-sectional image data created by the cross-sectional image creation unit is used to display the cross-sectional image.

The cross-sectional image display apparatus of claim 1 displays a cross-sectional image of a three-dimensional image based on three-dimensional image data representing the three-dimensional image. The three-dimensional image data is pre-stored in the storage unit, and the display unit displays the cross-sectional image.

The cross-sectional image described above includes: an image showing a cross section of the three-dimensional image when the three-dimensional image is cut along a cross-sectional cutting plane; a perspective image of the three-dimensional image when the cutting plane is set internally or externally to the three-dimensional image; and a combination of the perspective image and the image showing the cross section. The storage unit includes: a semiconductor storage element such as a RAM (Random Access Memory), an EEPROM (Electrically Erasable and Programmable Read Only Memory), or a flash EEPROM (Flash EEPROM); a portable storage medium such as Smart Media®, a flexible disk, or a magneto-optical disk; a fixed storage medium such as a hard disk drive; and an external storage device provided in a server computer connected to a network. Examples of the display unit include various displays, such as a liquid crystal display, a plasma display, an organic EL display, and a CRT display.

In the present invention, the presentation surface of the two-dimensional image presentation unit presents the two-dimensional image of the three-dimensional image. The designation unit designates the cross-sectional position at which the cross-sectional image is to be displayed in the three-dimensional image, which is virtually constructed in the space above the presentation surface so that the constructed three-dimensional image has dimensions corresponding to the two-dimensional image presented at the presentation surface and is located at a position corresponding to the two-dimensional image. The detection unit detects the cross-sectional position designated by the designation unit.

Then, in the present invention, the conversion unit converts the cross-sectional position detected by the detection unit into a cross-sectional position in the coordinate system of the three-dimensional image. The cross-sectional image creation unit creates cross-sectional image data representing the cross-sectional image of the three-dimensional image at the cross-sectional position converted by the conversion unit based on the cross-sectional position and the three-dimensional image data. Further, the control unit controls the display unit so that the cross-sectional image data created by the cross-sectional image creation unit is used to display the cross-sectional image.

That is, in the present invention, the cross-sectional position is set by presenting the two-dimensional image of the three-dimensional image to be displayed at the presentation surface of the two-dimensional image presentation unit and allowing the user to use the designation unit to designate the cross-sectional position where the cross-sectional image is to be displayed in the three-dimensional image virtually constructed in the space above the presentation surface, so that the constructed three-dimensional image has dimensions corresponding to the two-dimensional image presented on the presentation surface and is located at the position corresponding to the two-dimensional image. Accordingly, the user can designate the cross-sectional position using a more natural operation by directly cutting across the actual three-dimensional image. As a result, cross-sectional positions can be set consecutively and efficiently.

As described above, according to the cross-sectional image display apparatus of claim 1, displaying a cross-sectional image of a three-dimensional image based on three-dimensional image data representing the three-dimensional image is carried out by pre-storing the three-dimensional image data in the storage unit, presenting a two-dimensional image of the three-dimensional image on a predetermined presentation surface, designating the cross-sectional position where the cross-sectional image of a constructed three-dimensional image is to be displayed, by using the designation unit, in the state where the three-dimensional image in the space above the presentation surface is virtually constructed, so that the constructed three-dimensional image has the dimensions corresponding to the two-dimensional image presented on the presentation surface and is located at the position corresponding to the two-dimensional image, detecting the designated cross-sectional position, converting the detected cross-sectional position into the cross-sectional position in the coordinate system of the three-dimensional image, creating cross-sectional image data representing the cross-sectional image of the three-dimensional image at the converted cross-sectional position based on the cross-sectional position and the three-dimensional image data, and controlling the display unit so that the created cross-sectional image data is used to display the cross-sectional image. Therefore, the cross-sectional positions can be set consecutively and efficiently.

In addition, in the present invention, as described in the invention of claim 2, the two-dimensional image may be a plan view or a side view of the three-dimensional image, or a cross-sectional view of the three-dimensional image at a predetermined position. Accordingly, the cross-sectional position can be set with reference to the plan view or the side view of the three-dimensional image.

In the present invention, as described in the invention of claim 3, the designation unit may be a plate-like object and may designate the cross-sectional position by positioning a surface of the plate-like object so as to correspond to the cross-section to be displayed, and the cross-sectional image creation unit may create the cross-sectional image data so as to represent the cross-sectional image of an area at which the surface of the designation unit is positioned in the virtually constructed three-dimensional image. Accordingly, the cross-sectional position can be designated using a more natural operation by directly cutting across the actual three-dimensional image, allowing the cross-sectional position to be set in a more efficient manner.

Particularly, in the invention of claim 3, as described in the invention of claim 4, the display unit may also serve as the designation unit, and the surface of the plate-like designation unit may be a display surface that displays the cross-sectional image. Accordingly, the cross-sectional position can be designated by using the plate-like designation unit to actually cut across the three-dimensional image, and in this state, the cross-sectional image at the cross-sectional position can be displayed on the display surface of the designation unit, allowing the cross-sectional image to be displayed with an augmented level of reality.

In the present invention, as described in the invention of claim 5, the display unit may use an image signal produced based on the cross-sectional image data to electrically display the cross-sectional image, or project light carrying the cross-sectional image represented by the cross-sectional image data to display the cross-sectional image. (the so-called projector-based method).

In the present invention, as described in the invention of claim 6, the detection unit may be a position detection device that detects the cross-sectional position by detecting a designated position, and the designation unit is provided with a plurality of fixed pens based on which the position detection device detects the designated position. Accordingly, the present invention can then be configured by using an inexpensive position detection device, such as a tablet, and inexpensive pens widely commercially available in recent years, allowing the present invention to be implemented at low cost.

In the present invention, as described in the invention of claim 7, the two-dimensional image presentation unit may present the two-dimensional image by using an image signal produced based on the three-dimensional image data to electrically display the two-dimensional image. Accordingly, the two-dimensional image of the present invention can be presented without human labor, allowing improvement in convenience.

On the other hand, to achieve the above object, the cross-sectional image display method of claim 8 is a cross-sectional image display method for displaying a cross-sectional image of a three-dimensional image based on three-dimensional image data representing the three-dimensional image, including: pre-storing the three-dimensional image data in a storage unit; presenting a two-dimensional image of the three-dimensional image at a predetermined presentation surface; designating, using a designation unit, a cross-sectional position within the three-dimensional image for the cross-sectional image that is to be displayed, in a state in which the three-dimensional image is virtually constructed in a space above the presentation surface, such that the constructed three-dimensional image has dimensions, and is located at a position, corresponding to the two-dimensional image presented at the presentation surface; detecting the designated cross-sectional position; converting the detected cross-sectional position into a cross-sectional position in a coordinate system of the three-dimensional image; creating cross-sectional image data representing the cross-sectional image of the three-dimensional image at the converted cross-sectional position based on the cross-sectional position and the three-dimensional image data; and controlling a display unit such that the created cross-sectional image data is used to display the cross-sectional image.

Therefore, since the cross-sectional image display method described in claim 8 provides an effect similar to that of the invention of claim 1, the cross-sectional positions can be set consecutively and efficiently as in the invention of claim 1.

In the invention of claim 8, as described in the invention of claim 9, the designation unit may be a plate-like object and may designate the cross-sectional position by positioning a surface of the plate-like object so as to correspond to the cross-section to be displayed, and the cross-sectional image data may be created so as to represent the cross-sectional image of an area at which the surface of the designation unit is positioned in the virtually constructed three-dimensional image. Accordingly, the cross-sectional position can be designated using a more natural operation by directly cutting across the actual three-dimensional image, allowing the cross-sectional position to be set more efficiently.

In particular, in the invention of claim 9, as described in the invention of claim 10, the display unit may also serve as the designation unit, and the surface of the plate-like designation unit may be the display surface that displays the cross-sectional image. Accordingly, the cross-sectional position can be designated by using the plate-like designation unit to actually cut across the three-dimensional image, and in this state, the cross-sectional image at the cross-sectional position can be displayed on the display surface of the designation unit, allowing the cross-sectional image to be displayed in a state with an augmented level of reality.

On the other hand, to achieve the above object, the cross-sectional image display program described in claim 11 is, a cross-sectional image display program executed by a cross-sectional image display apparatus that displays a cross-sectional image of a three-dimensional image based on three-dimensional image data representing the three-dimensional image and includes a storage unit for pre-storing the three-dimensional image data, a two-dimensional image presentation unit having a presentation surface that presents a two-dimensional image of the three-dimensional image, a designation unit that designates a cross-sectional position within the three-dimensional image for the cross-sectional image that is to be displayed, in a state in which the three-dimensional image is virtually constructed in a space above the presentation surface, such that the constructed three-dimensional image has dimensions, and is located at a position, corresponding to the two-dimensional image presented at the presentation surface, and a detection unit for detecting the cross-sectional position designated by the designation unit. The program causing a computer to execute: a conversion step of converting the cross-sectional position detected by the detection unit into a cross-sectional position in a coordinate system of the three-dimensional image; a cross-sectional image creation step of creating cross-sectional image data representing the cross-sectional image of the three-dimensional image at the cross-sectional position converted in the conversion step based on the cross-sectional position and the three-dimensional image data; and a control step of controlling a display unit such that the cross-sectional image data created in the cross-sectional image creation step is used to display the cross-sectional image.

Therefore, according to the cross-sectional image display program described in claim 11, since it causes a computer to provide an effect similar to that in the invention of claim 1, it allows the cross-sectional positions to be set consecutively and efficiently as in the invention of claim 1.

In the invention of claim 11, as described in the invention of claim 12, the designation unit may be a plate-like object and may designate the cross-sectional position by positioning a surface of the plate-like object so as to correspond to the cross-section to be displayed, and in the cross-sectional image creation step, the cross-sectional image data may be created so as to represent the cross-sectional image of an area at which the surface of the designation unit is positioned in the virtually constructed three-dimensional image. Accordingly, the cross-sectional position can be designated using a more natural operation by directly cutting across the actual three-dimensional image, allowing the cross-sectional position to be set more efficiently.

In particular, in the invention of claim 12, as described in the invention of claim 13, the display unit may also serve as the designation unit, and the surface of the plate-like designation unit may be the display surface for displaying the cross-sectional image. Accordingly, the cross-sectional position can then be designated by using the plate-like designation unit to actually cut across the three-dimensional image, and in this state, the cross-sectional image at the cross-sectional position can be displayed on the display surface of the designation unit, allowing the cross-sectional image to be displayed with an augmented level of reality.

Effects of the Invention

According to the present invention, display of a cross-sectional image of a three-dimensional image based on three-dimensional image data representing the three-dimensional image is carried out by pre-storing the three-dimensional image data in the storage unit, presenting a two-dimensional image of the three-dimensional image on a predetermined presentation surface, virtually constructing the three-dimensional image in the space above the presentation surface so that the constructed three-dimensional image has dimensions corresponding to the two-dimensional image presented on the presentation surface and is located at a position corresponding to the two-dimensional image, using the designation unit to designate the cross-sectional position in the constructed three-dimensional image at which the cross-sectional image is to be displayed, detecting the designated cross-sectional position, converting the detected cross-sectional position into a cross-sectional position in the coordinate system of the three-dimensional image, creating cross-sectional image data representing the cross-sectional image of the three-dimensional image at the converted cross-sectional position based on the cross-sectional position and the three-dimensional image data, and controlling a display unit so that the created cross-sectional image data is used to display the cross-sectional image, so that cross-sectional positions can be set consecutively and efficiently.

BEST MODE FOR CARRYING OUT THE INVENTION

Exemplary embodiments of the present invention will be described below in detail with reference to the drawings.

First Embodiment

First, the configuration of a cross-sectional image display system 10 to which the present invention is applied will be described with reference to FIG. 1.

Figure 1:
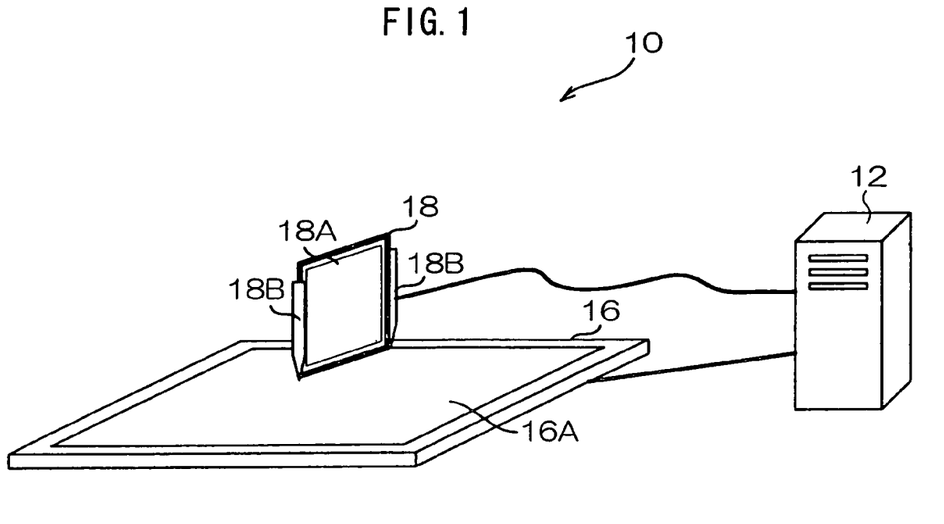
FIG. 1 is a schematic perspective view showing the configuration of the cross-sectional image display system according to a first embodiment.

As shown in FIG. 1, the cross-sectional image display system 10 according to this embodiment includes a personal computer (hereinafter referred to as "PC") 12 responsible for the operation of the whole system 10, a tablet 16, and a small plate-like display device 18.

The display device 18 according to this embodiment includes a display surface 18A of a liquid crystal display. The display medium of the display device 18 is not limited to a liquid crystal display, but various displays currently available can be applied. However, since the display device 18 is used to consecutively designate cross-sectional positions (which will be described later in detail), a thin display, such as an organic EL display or a plasma display, is preferably applied in consideration of ease of operation of designating the cross-sectional positions.

A pair of pens 18B is fixed with one at each end of the display device 18 so that the tips of the pens 18B are oriented vertically downward when the display device 18 is in an upright position. The tablet 16 can detect the coordinates of the position that the tip of each of the pens 18B designates. The tablet 16 can therefore detect the position coordinates at both the lower ends of the display device 18 on a position detection surface 16A (hereinafter referred to as "designated cross-sectional position coordinates") when the display device 18 is disposed so that the tips of the pens 18B are oriented downward (hereinafter referred to as "normal posture") and positioned within a predetermined position detection tolerance range in the space above the position detection surface 16A of the tablet 16.

The position detection surface 16A of the tablet 16 also serves as the presentation surface of the invention on which is placed a sheet on which a two-dimensional image is drawn (hereinafter referred to as "two-dimensional presentation image") to present the two-dimensional presentation image such as, for example, a plan image, a side image, or a perspective image of a three-dimensional image from which a cross-sectional image is displayed, or the cross-sectional image at a predetermined position in the three-dimensional image.

The tablet 16 is electrically connected to the PC 12, which can then control the operation of the tablet 16 and acquire the designated cross-sectional position coordinates detected by the tablet 16. The display device 18 is also electrically connected to the PC 12, which can then display a given image on the display surface 18A of the display device 18. The PC 12 includes peripheral devices, such as a keyboard and a display, as described later. These peripheral devices are omitted from FIG. 1.

The core configuration of the electrical system of the PC 12, which plays a particularly important role in the present system, will be described with reference to FIG. 2.

Figure 2:
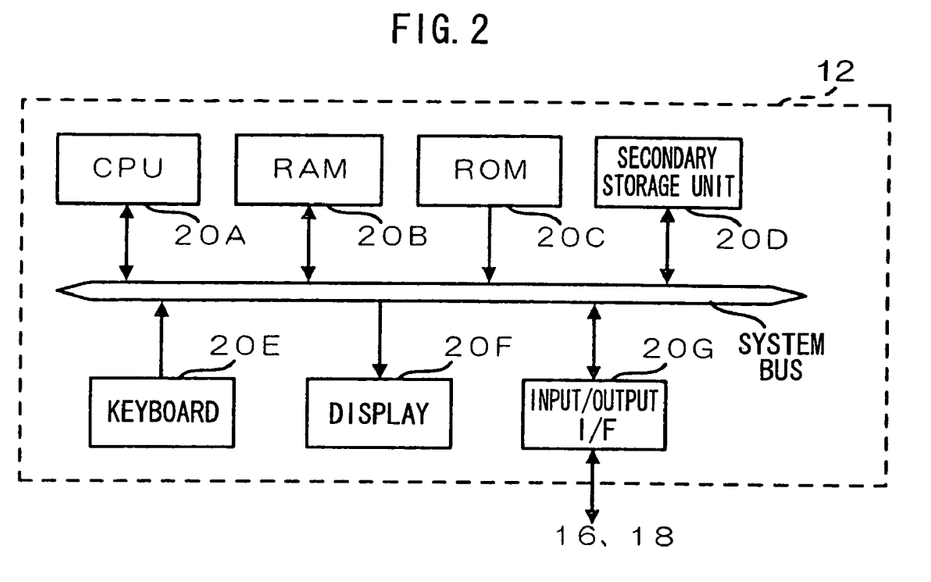
FIG. 2 is a block diagram showing the core configuration of an electrical system of a personal computer (PC) according to the embodiment.

As shown in FIG. 2, the PC 12 according to this embodiment includes a CPU (Central Processing Unit) 20A responsible for the operation of the whole PC 12, a RAM 20B used as a work area or the like when the CPU 20A runs various processing programs, a ROM 20C that stores various control programs, various parameters and the like in advance, a secondary storage unit (a hard disk drive in this embodiment) 20D used to store various information, a keyboard 20E used to input various information, a display 20F used to display various information, and an input/output I/F (interface) 20G responsible for sending and receiving various signals to and from external devices and the like. These components are electrically interconnected via a system bus BUS.

The CPU 20A, therefore, accesses the RAM 20B, the ROM 20C, and the secondary storage unit 20D, acquires various input information through the keyboard 20E, displays various information at the display 20F, and sends and receives various signals to and from the external devices and the like through the input/output I/F 20G. The input/output I/F 20G is electrically connected not only to the tablet 16 and the display device 18 but also to a printer (not shown).

Figure 3:
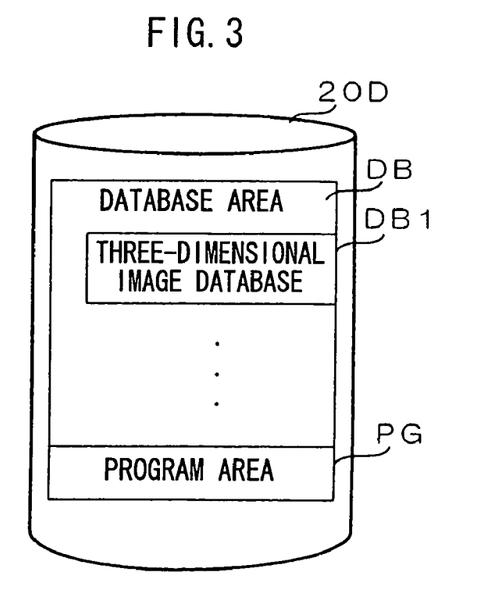
FIG. 3 is a diagrammatic view showing the primary storage contents in a secondary storage unit provided in the PC according to the embodiment.

On the other hand, FIG. 3 diagrammatically shows the primary storage contents in the secondary storage unit 20D provided in the PC 12. As shown in FIG. 3, the secondary storage unit 20D includes a database area DB for storing various databases and a program area PG for storing programs and the like for performing various processing.

The database area DB includes a three-dimensional image database DB1 for storing three-dimensional image data representing a three-dimensional image from which a cross-sectional image is displayed in the cross-sectional image display system 10. In the program area PG, a cross-sectional image display processing program, which will be described later, and a general-purpose computer graphics application program (hereinafter referred to as a "CG program") are stored (installed) in advance. In the cross-sectional image display system 10 according to this embodiment, the three-dimensional image data applies coordinate data that expresses the three-dimensional shape of a three-dimensional object in the form of coordinates, as well as color data and shape image data of at least one of the surfaces and the interior of the three-dimensional object. However, the three-dimensional image data is not limited thereto, but may be, for example, data formed of only the coordinate data described above.

The CG program according to this embodiment has the function of creating two-dimensional image data that represents the cross-sectional image (hereinafter referred to as "cross-sectional image creation function") at the cross-sectional position indicated by the position data indicating a preset cross-sectional position in the three-dimensional image represented by the three-dimensional image data, based on the three-dimensional image data stored in the three-dimensional image database DB1. The cross-sectional image creation function of the CG program according to this embodiment sets coordinates indicating the position of a virtual camera 24, which will be described later (see also FIG. 5B), and the coordinates indicating the point of regard of the camera 24, so as to create the two-dimensional image data representing the cross-sectional image described above. The CG program also has the function of creating two-dimensional image data (hereinafter referred to as "two-dimensional image creation function") that represents a two-dimensional image, such as a plan image, a side image, a perspective image, or a ceiling plan image of the three-dimensional image represented by the three-dimensional image data, as well as a cross-sectional image at a predetermined position in the three-dimensional image, based on the three-dimensional image data stored in the three-dimensional image database DB1. Since these functions are well-known general functions in conventional CG programs, further description of these functions is omitted.

Figure 4:
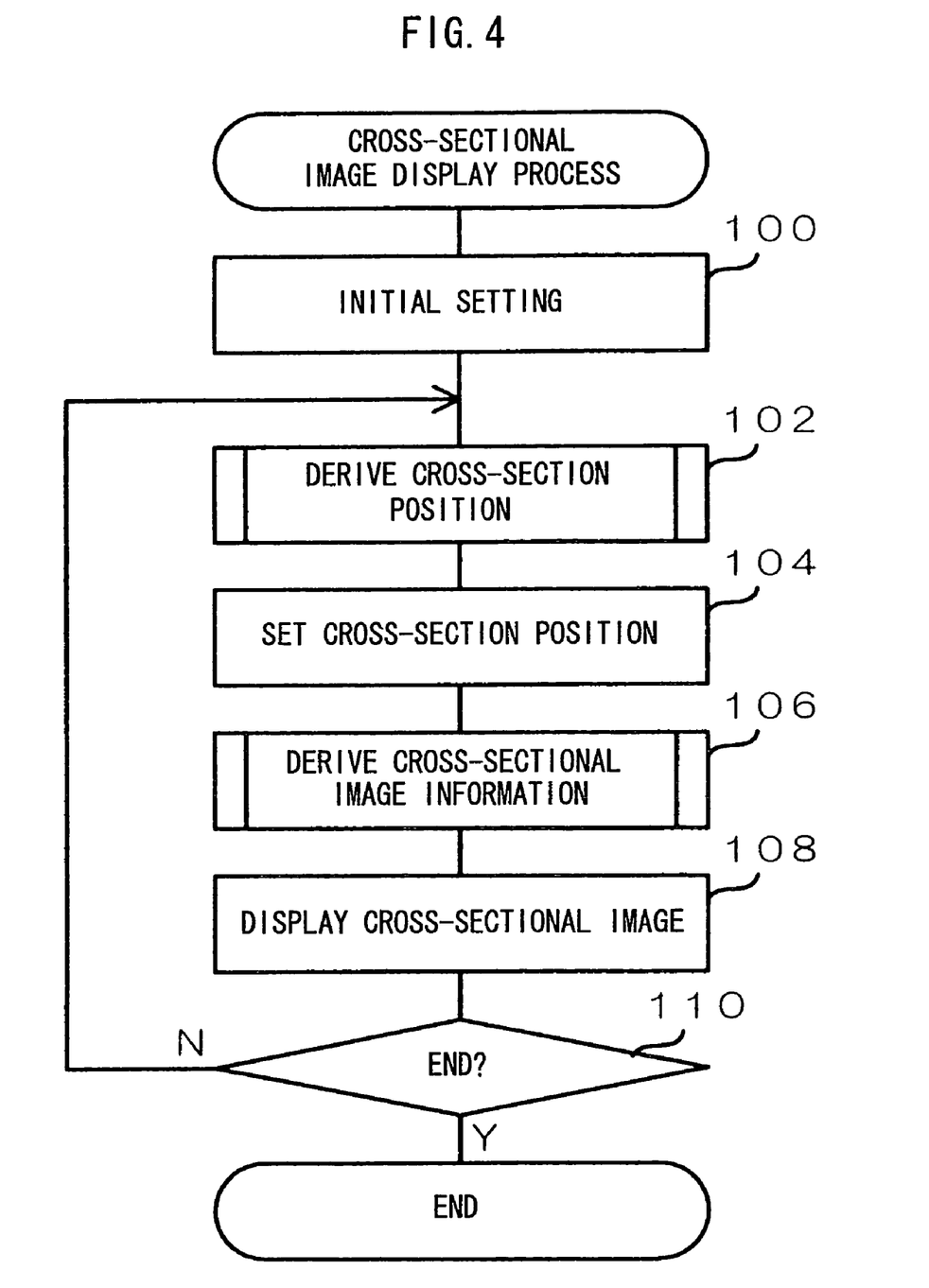
FIG. 4 is a flowchart showing the flow of processes in the cross-sectional image display processing program according to the embodiment.

The operation of the cross-sectional image display system 10 according to this embodiment will be described with reference to FIG. 4. FIG. 4 is a flowchart showing the flow of processes in the cross-sectional image display processing program executed by the CPU 20A in the PC 12, when a user inputs an instruction through the keyboard 20E to execute a cross-sectional image display process.

Before executing the cross-sectional image display processing program, the user designates a three-dimensional image from which a cross-sectional image is to be displayed, from among the three-dimensional images registered in the three-dimensional image database DB1, and uses the two-dimensional image creation function of the CG program and the printer (not shown) to create a sheet on which a two-dimensional presentation image (being any one of a plan image, side image, perspective image or cross-sectional view at a predetermined position in the three-dimensional image) to be presented at the position detection surface 16A of the tablet 16 is printed at a predetermined size.

The user places the created sheet at a predetermined position on the position detection surface 16A (in this embodiment, the predetermined position is selected so that the center position of the sheet substantially coincides with the center position of the position detection surface 16A), and then performs an instruction input that instructs execution of the cross-sectional image display process described above. In response, the CPU 20A starts the execution of the cross-sectional image display processing program shown in FIG. 4.

First, in step 100 in FIG. 4, initial setting is carried out to initialize detection coordinate axes on the tablet 16, and in the next step 102, a cross-sectional position derivation process of deriving the cross-sectional position designated by the user according to the position of the display device 18 is executed.

Here, after the designated three-dimensional image has been virtually constructed in the space above the position detection surface 16A of the tablet 16 such that the constructed three-dimensional image has dimensions corresponding to the two-dimensional presentation image presented on the position detection surface 16A and is located at a position corresponding to the two-dimensional presentation image, the user designates the cross-sectional position by positioning the display surface 18A of the display device 18 at a cross-sectional position for display in the constructed three-dimensional image.

In the above cross-sectional position derivation process, the tablet 16 provides designated cross-sectional position coordinates, which are then converted into coordinates in a coordinate system of the three-dimensional image as described below.

Figure 5A:
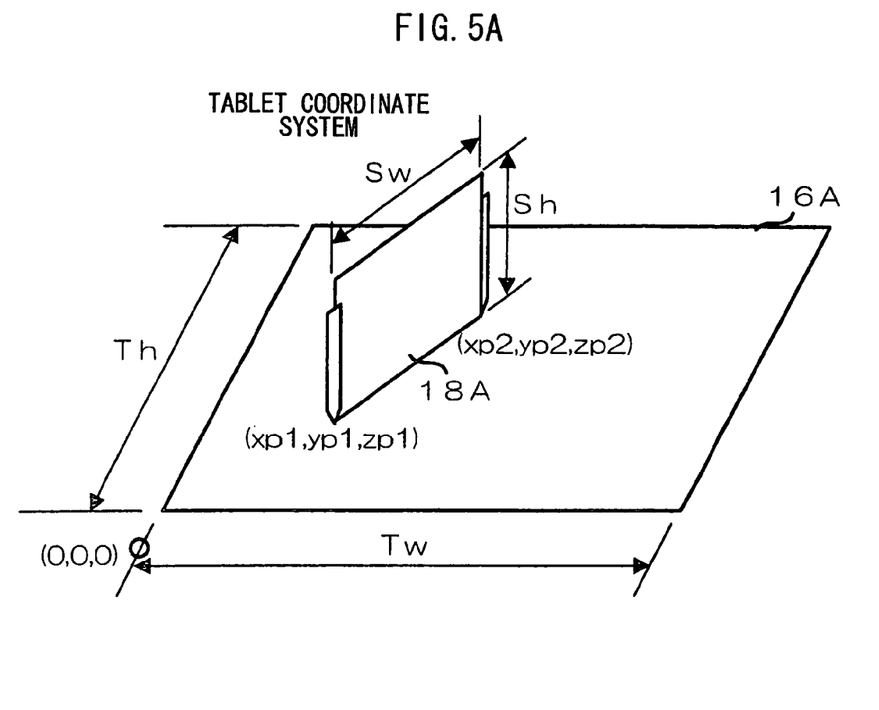
FIG. 5A is a schematic view for explaining the conversion of designated cross-sectional position coordinates in the coordinate system of a tablet into those in the coordinate system of a three-dimensional image as performed by the cross-sectional image display processing program according to the embodiment.
Figure 5B:
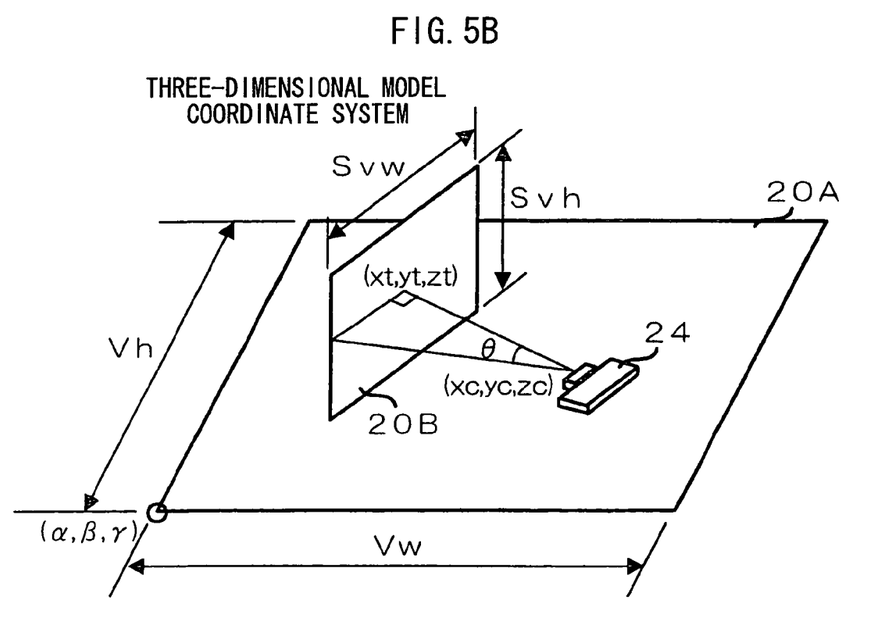
FIG. 5B is a schematic view for explaining the conversion of designated cross-sectional position coordinates in the coordinate system of a tablet into those in the coordinate system of a three-dimensional image as performed by the cross-sectional image display processing program according to the embodiment.

Further, as shown in FIG. 5A, the horizontal size and the vertical size of the position detection surface 16A in the coordinate system of the tablet 16 are respectively indicated as Tw and Th, and the horizontal size and the vertical size of the display surface 18A of the display device 18 are respectively indicated as Sw and Sh. As shown in FIG. 5B, the horizontal size and the vertical size of a virtual rectangular surface 20A corresponding to the position detection surface 16A are respectively indicated as Vw and Vh in the coordinate system of the three-dimensional image, and the horizontal size and the vertical size of a virtual rectangular surface 20B corresponding to the display surface 18A are respectively indicated as Svw and Svh in the coordinate system of the three-dimensional image. Further, the origin of the rectangular surface 20A is indicated as $(\alpha, \beta, \gamma)$, and the angle of view of the camera 24 subtending the rectangular surface 20B is indicated as $\theta$, where the camera 24 is virtually provided so that the center point of the rectangular surface 20B coincides with the center position of the imaged region in the coordinate system of the three-dimensional image. Further, the ratio of the size of the position detection surface 16A to the size of the rectangular surface 20A is 1:a, that is, Tw×a=Vw, Th×a=Vh.

In the cross-sectional image display system 10 according to this embodiment, the above parameters (the above parameters being the horizontal size Tw and the vertical size Th of the position detection surface 16A, the horizontal size Sw and the vertical size Sh of the display surface 18A, the horizontal size Vw and the vertical size Vh of the rectangular surface 20A, the horizontal size Svw and the vertical size Svh of the rectangular surface 20B, the origin $(\alpha, \beta, \gamma)$, the angle of view $\theta$, and "a".) are fixed values and stored in a predetermined area in the secondary storage unit 20D.

For the designated cross-sectional position coordinates acquired by the tablet 16, when the position coordinates of the tip of one of the pens 18B are (xp1, yp1, zp1), and the position coordinates of the tip of the other one of the pens 18B are (xp2, yp2, zp2), the coordinates (xt, yt, zt) indicating the center position of the rectangular surface 20B can be calculated by the following equation (1).

[Equation 1]

$$(xt, yt, zt) = \left( \frac{a(xp1 + xp2)}{2} + \alpha, \frac{a(yp1 + yp2)}{2} + \beta, \frac{Svh}{2} + \gamma \right) \quad (1)$$

Then the distance L between the tips of the pens 18B can be expressed by the following equation (2).

[Equation 2]

$$L = \sqrt{(yp1 - yp2)^2 + (xp1 - xp2)^2} \quad (2)$$

Therefore, the coordinates (xc, yc, zc) indicating the position of the camera 24 can be calculated by the following equation (3).

[Equation 3]

$$(xc, yc, zc) = \left( xt + \frac{Svw}{2\tan\theta} \frac{(-yp1 + yp2)a}{L}, yt + \frac{Svw}{2\tan\theta} \frac{(-xp1 + xp2)a}{L}, zt \right) \quad (3)$$

The CPU 20A substitutes the pre-stored parameter values and the designated cross-sectional position coordinates acquired by the tablet 16 into the equation (3) to calculate the coordinates (xc, yc, zc) indicating the position of the camera 24.

Figure 6:
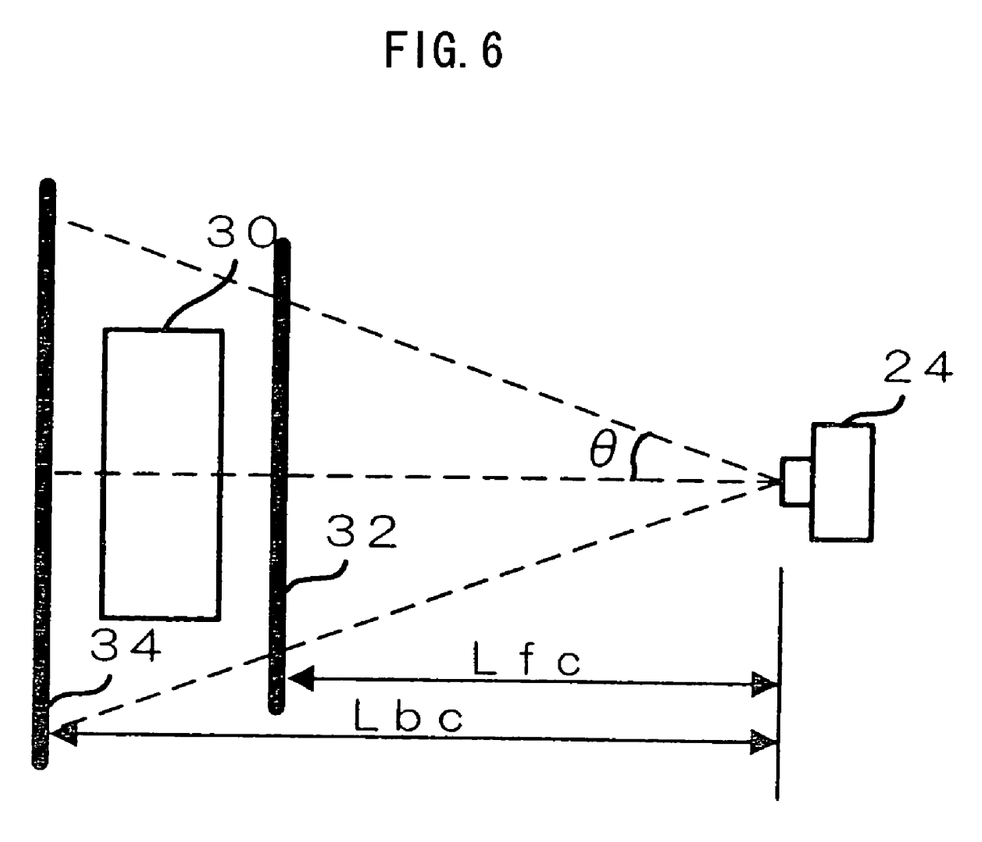
FIG. 6 is a schematic view for explaining a cross-sectional image creation function implemented in a computer graphic (CG) program according to the embodiment.

In the cross-sectional image creation function implemented in the CG program according to this embodiment, as shown in FIG. 6 by way of example, it is assumed that the virtual camera 24 images a three-dimensional object 30 for processing. Then, a front cut-off plane 32 is set in front of the camera 24, and a rear cut-off plane 34 is set at a position away from the front cut-off plane 32 of the camera 24. The horizontal viewing angle (angle of view) of the camera 24 is set as θ, the distance from the position at which the camera 24 captures an image to the front cut-off surface 32 is set as Lfc, and the distance from the position at which the camera 24 captures the image to the back cut-off surface 34 is set as Lbc. Then, an image that satisfies the relationship Lfc≦d≦Lbc, where d is the distance from the camera 24, is extracted as the cross-sectional image to be created.

Therefore, by setting the angle of view θ to '0' in the cross-sectional image creation function, the distances Lfc and Lbc correspond to the coordinates (xt, yt, zt), so that two-dimensional image data representing the image showing the cross-section is created. Further, by setting the distance Lfc to '0' and the distance Lbc to '∞' (infinity), two-dimensional image data representing a perspective image can be created. By setting the distance Lfc to (Svw/tan θ) and the distance Lbc to '∞' (infinity), two-dimensional image data representing the combined image of the perspective image and the image showing the cross-section can be created.

Therefore, in the initial setting executed in the process in the step 100, the angle of view θ is set to '0' to display only the image showing the cross-section. Similarly, the distance Lfc is set to '0' and the distance Lbc is set to '∞' to display the perspective image, while the distance Lfc is set to (Svw/tan θ) and the distance Lbc is set to '∞' to display the combined image of the perspective image and the image showing the cross-section.

In the next step 104, the coordinates (xt, yt, zt) and (xc, yc, zc), derived in the process in the step 102 described above, are set in the CG program. Then in the next step 106, two-dimensional image data representing the cross-sectional image corresponding to the derived cross-sectional position is created by executing the cross-sectional image creation function of the CG program. Then in the next step 108, the display device 18 is controlled so as to display the cross-sectional image represented by the image data on the display surface 18A by using the created two-dimensional image data. The process then proceeds to step 110.

The step 110 determines whether or not the time to terminate the execution of the cross-sectional image display processing program has arrived. When the determination is NO, the process returns to the step 102, and when the determination is YES, the cross-sectional image display processing program is terminated. In the cross-sectional image display processing program according to this embodiment, the termination timing described above is the time when the user inputs an instruction to stop the execution of the cross-sectional image display processing program, but the timing is not limited thereto. Other timings can of course be applied, such as the time when the power switch of the PC 12 is turned off, the time when the tablet 16 can no longer detect the position of the display device 18, or the like.

Since the cross-sectional image display processing program repeats the execution of the processes in the steps 102 to 108 until a predetermined timing is reached, when the user moves the display device 18 over the position detection surface 16A of the tablet 16 within the detectable range, the cross-sectional images corresponding to the positions of the display surface 18A of the display device 18 at various points of time are consecutively displayed on the display surface 18A in real-time.

Figure 7:
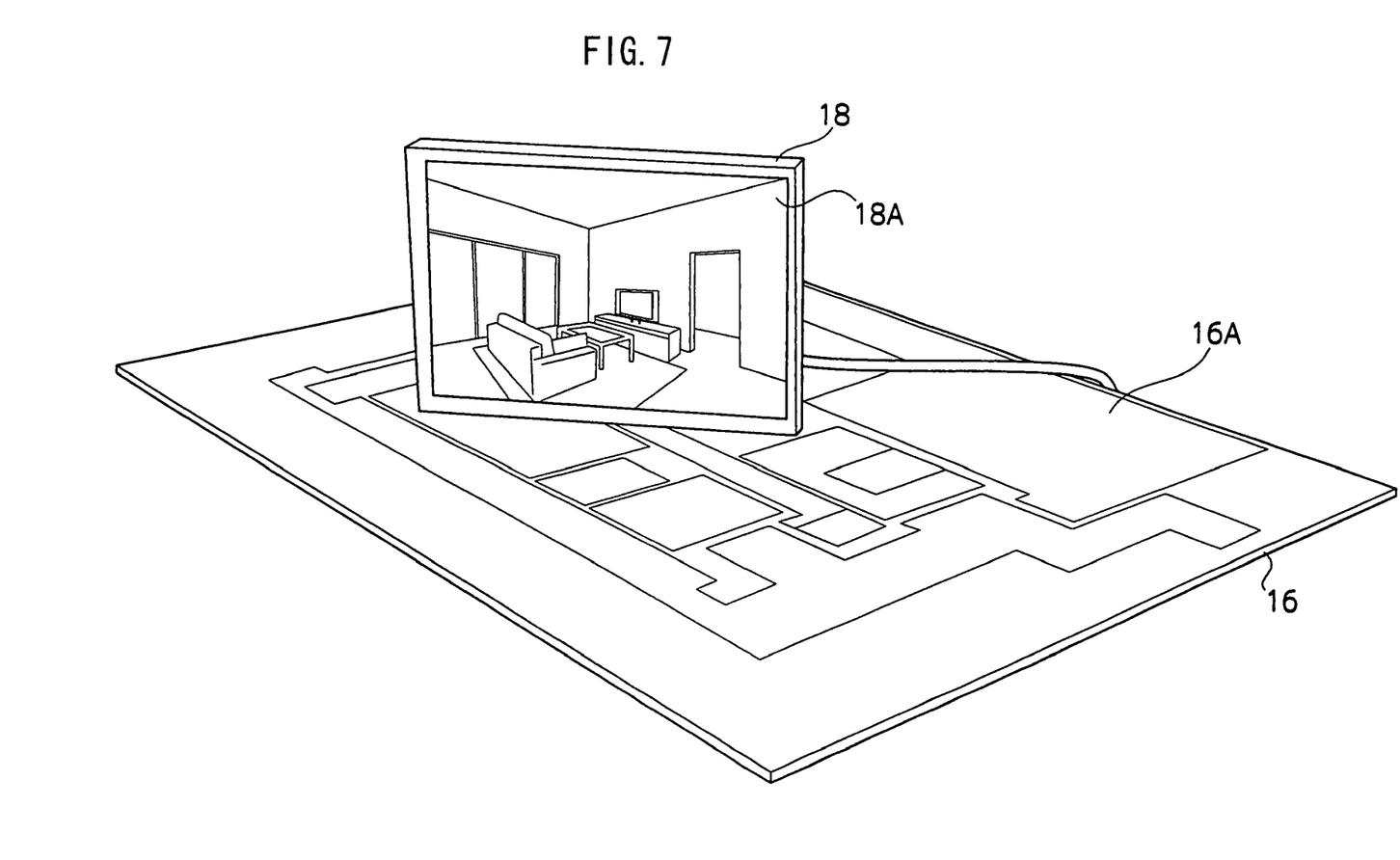
FIG. 7 is a perspective view showing an exemplary cross-sectional image displayed by the cross-sectional image display system according to the embodiment.
Figure 8:
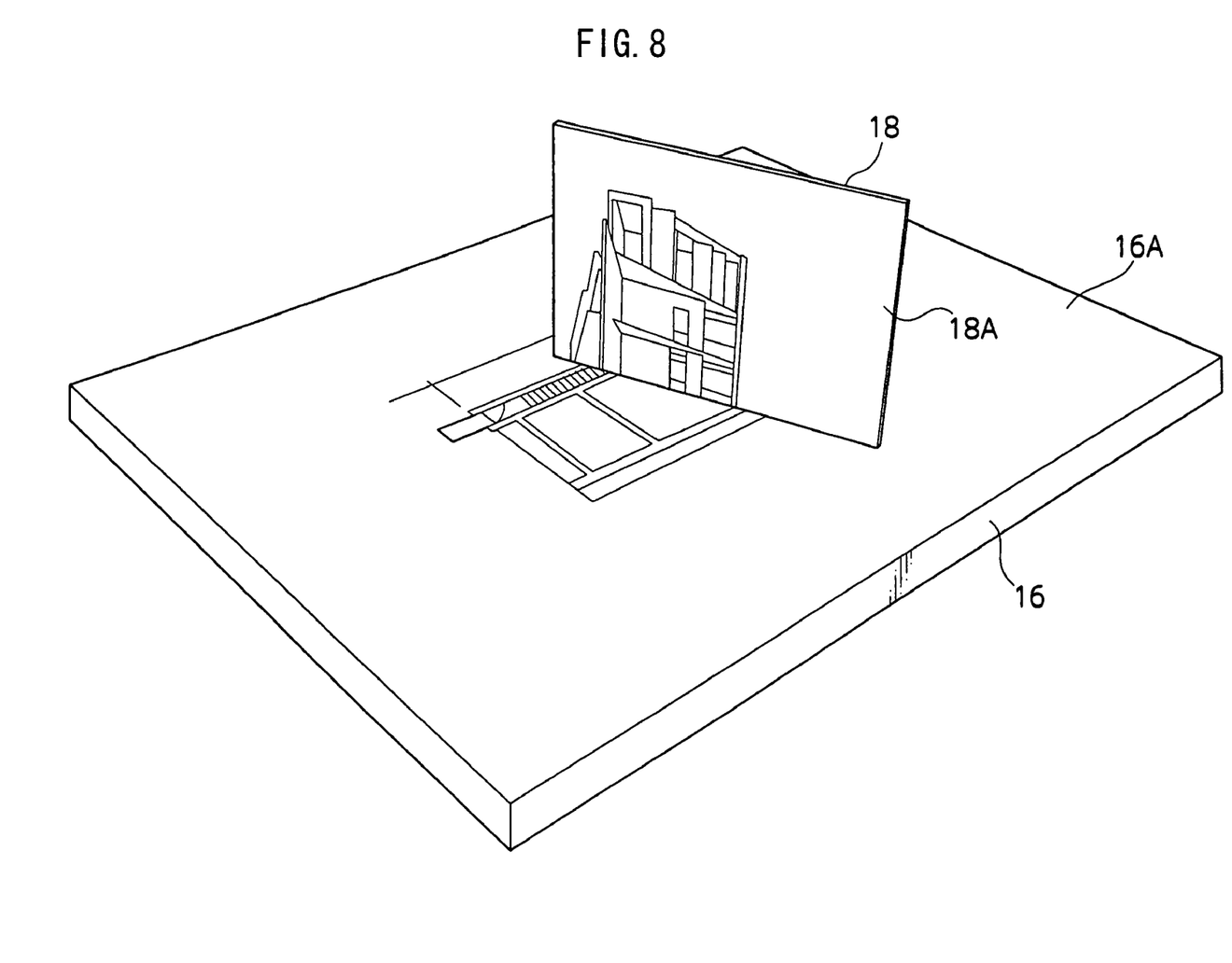
FIG. 8 is a perspective view showing another exemplary cross-sectional image displayed by the cross-sectional image display system according to the embodiment.

Each of the cross-sectional images consecutively displayed on the display surface 18A is, as shown in FIG. 7 and FIG. 8 by way of example, a cross-sectional image in the three-dimensional image virtually constructed in the space above the position detection surface 16A so that the constructed three-dimensional image has dimensions corresponding to the image (plan images in FIG. 7 and FIG. 8) drawn on the sheet placed on the position detection surface 16A of the tablet 16 and is located at a position corresponding to that image, allowing the cross-sectional image to be displayed with an augmented level of reality. It is noted that the pens 18B are omitted from FIG. 7 and FIG. 8.

As described above in detail, in this embodiment, display of a cross-sectional image of a three-dimensional image based on three-dimensional image data representing the three-dimensional image is carried out by pre-storing the three-dimensional image data in a storage unit (the secondary storage unit 20D in this embodiment), presenting a two-dimensional image (a plan image or the like in this embodiment) of the three-dimensional image on a predetermined presentation surface (the position detection surface 16A in this embodiment), virtually constructing the three-dimensional image in the space above the presentation surface so that the constructed three-dimensional image has dimensions corresponding to the two-dimensional image presented on the presentation surface and is located at a position corresponding to the two-dimensional image, using a designation unit (the display device 18 in this embodiment) to designate the cross-sectional position in the constructed three-dimensional image for the cross-sectional image that is to be displayed, detecting the designated cross-sectional position, converting the detected cross-sectional position into a cross-sectional position in the coordinate system of the three-dimensional image, creating cross-sectional image data representing the cross-sectional image of the three-dimensional image at the converted cross-sectional position based on the cross-sectional position and the three-dimensional image data, and controlling a display unit (the display device 18 in this embodiment) so that the created cross-sectional image data is used to display the cross-sectional image, so that cross-sectional positions can be set consecutively and efficiently.

In this embodiment, since the two-dimensional image is the plan view, side view, or perspective view of the three-dimensional image, or the cross-sectional view at a predetermined position of the three-dimensional image, the cross-sectional position can be set with reference to the plan view, side view, perspective view, or cross-sectional view of the three-dimensional image.

In this embodiment, since the designation unit is a plate-like object that designates the cross-sectional position by having the plate-like object positioned so that the surface thereof corresponds to the cross-section to be displayed, and the cross-sectional image data is created so that it represents the cross-sectional image of the area where the surface of the designation unit is positioned in the virtually constructed three-dimensional image, the cross-sectional position can be designated using a more natural operation by directly cutting across the actual three-dimensional image, allowing the cross-sectional position to be set in a more efficient manner.

In particular, in this embodiment, since the display unit also serves as the designation unit, and the surface of the plate-like designation unit is the display surface for displaying the cross-sectional image, the cross-sectional position can be designated by using the plate-like designation unit to actually cut across the three-dimensional image, and in this state, the cross-sectional image at the cross-sectional position can be displayed at the display surface of the designation unit, allowing the cross-sectional image to be displayed with an augmented level of reality.

Further, in this embodiment, since the detection unit of the present invention is a tablet (the tablet 16 in the above description) that detects the cross-sectional position by detecting the designated position, and the designation unit of the invention is provided with plural fixed pens (the pens 18B in the above description) with which the tablet detects the designated position, the present invention can be configured by using an inexpensive tablet and inexpensive pens that have been widely commercially available in recent years, allowing the present invention to be realized at low cost.

In this embodiment, description has been given of a case in which the display device 18 is electrically connected to the PC 12 with a cable. However the present invention is not limited thereto, but may be connected wirelessly. In such a case, the display device 18 can be more easily moved than in the present embodiment, providing improved ease of use.

Second Embodiment

The first embodiment has been described with reference to a case in which the display unit of the present invention uses the image signal produced based on the cross-sectional image data to electrically display the cross-sectional image. However, the second embodiment will be described with reference to a case in which the display unit of the present invention projects light carrying the cross-sectional image represented by the cross-sectional image data (the projector-based method) to display the cross-sectional image.

First, the configuration of the cross-sectional image display system 10' according to the second embodiment will be described with reference to FIG. 9. The same structural components in FIG. 9 and in FIG. 1 have the same reference characters as those in FIG. 1 and description thereof is omitted.

Figure 9:
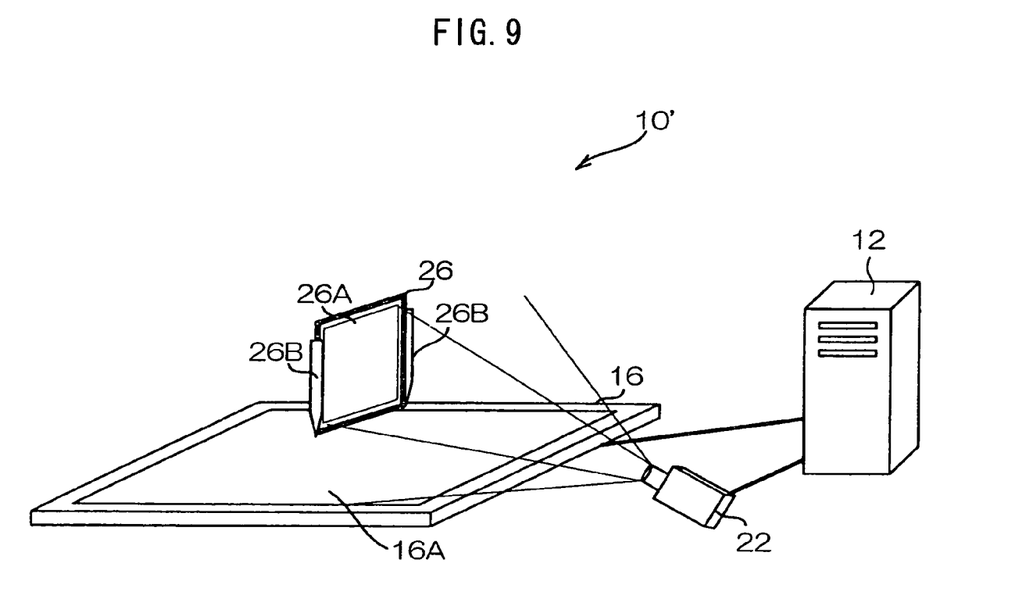
FIG. 9 is a schematic perspective view showing the configuration of the cross-sectional image display system according to a second embodiment.

As shown in FIG. 9, the cross-sectional image display system 10' according to the second embodiment only differs from the cross-sectional image display system 10, according to the first embodiment described above, in that the display device 18 is replaced with a plate-like screen 26 and a projector 22 is newly provided to project an image onto the display surface 26A of the screen 26.

As shown in FIG. 9, a pair of pens 26B are fixed with one at each end of the screen 26, according to this embodiment, so that the tips of the pens 26B are oriented vertically downward when the screen 26 is in a upright position, as in the display device 18 according to the first embodiment described above. The tablet 16 can detect the coordinates of the position that the tip of each of the pens 26B designates. The tablet 16 can therefore detect the position coordinates at both of the lower ends of the screen 26 on the position detection surface 16A (designated cross-sectional position coordinates) when the screen 26 is disposed so that the tips of the pens 26B are oriented downward (hereinafter referred to as "normal posture") and positioned within a predetermined position detection tolerance range in the space above the position detection surface 16A of the tablet 16.

The projector 22 is electrically connected to the PC 12, which can control the operation of the projector 22. The projector 22 projects light carrying an image to be displayed on the screen 26 to display the image, and is disposed at a predetermined position from which the projector 22 can project the image on the display surface 26A of the screen 26 wherever the screen 26 is positioned in a range within which designated cross-sectional position coordinates can be detected.

In the cross-sectional image display system 10' according to this embodiment, when the user inputs an instruction to execute a cross-sectional image display process, the system 10' executes a process substantially the same as the cross-sectional image display processing program according to the first embodiment described above (see FIG. 4), except for a difference whereby the CG program executes the cross-sectional image creation function twice to display one cross-sectional image, in consideration of the relative difference between the position of the camera 24 virtually provided in the coordinate system of the three-dimensional image and the position where the projector 22 is disposed.

That is, in this case, the CG program creates two-dimensional image data representing the cross-sectional image as in the first embodiment described above, and maps the cross-sectional image represented by the two-dimensional image data on the rectangular surface 20B (see also FIG. 5B).

Then, the CG program virtually disposes the camera 24 such that the position of the camera 24 relative to the rectangular surface 20B has the same positional relationship as the position of the projector 22 relative to the display surface 26A of the screen 26, and in this state, uses the camera 24 to capture the cross-sectional image mapped on the rectangular surface 20B. The CG program then creates two-dimensional image data representing the captured image as the data representing the image to be displayed on the screen 26.

In the process of step 108 of the cross-sectional image display processing program, the CPU 20A uses the two-dimensional image data created in the above process to control the projector 22 to project the cross-sectional image represented by the image data onto the display surface 26A of the screen 26.

The second embodiment also provides an effect similar to that in the first embodiment described above, and the cross-sectional image can be displayed without communicating with the screen 26, allowing improvement in convenience.

In each of the above embodiments, although description has been given of a case in which a sheet, on which a two-dimensional image, such as a plan image or a side image of the three-dimensional image from which a cross-sectional image is displayed, is printed, is placed and presented on the position detection surface 16A of the tablet 16, the present invention is not limited thereto. For example, the two-dimensional image can be electrically displayed and presented by using an image signal produced based on the three-dimensional image data. An example of such a configuration is a so-called tablet PC in which the tablet 16 is replaced with a display unit provided with a touch panel display configured by a touch panel overlaid on the display surface. In this case, there is no need to prepare a sheet on which a two-dimensional image to be presented is printed, allowing improvement in convenience.

In each of the above embodiments, the description has been made of a case in which the pens 18B that are detectable by the tablet 16, are attached to the display device 18 or the screen 26, to detect the position of the display device 18 or the screen 26 (designated cross-sectional position). However, the present invention is not limited thereto. For example, it is possible to employ a configuration that detects the designated cross-sectional position according to the principle of triangulation based on the result of detection performed by a detection unit by providing a sound source that produces supersonic waves and a light source that emits light in the display device 18 or the screen 26 and providing a detection unit that detects the supersonic waves and the light in the position detection device (the tablet 16 in the above embodiments). Furthermore, it is possible to employ a configuration in which a plurality of light sources are provided in the display device 18 or the screen 26, and an imaging device that images the display device 18 or the screen 26 is provided in the position detection device so as to detect the designated cross-sectional position by identifying the positions of the light beams from the plurality of light sources using an image captured by the imaging device. Similar effects to those in the above embodiments may also be obtained in this case.

In each of the above embodiments, description has been given of a case in which the PC 12 converts the coordinate system of the tablet 16 into the coordinate system of three-dimensional image. However, the present invention is not limited thereto. For example, a configuration may be employed in which the tablet 16 can convert its own coordinate system into the coordinate system of the three-dimensional image. Similar effects to those in the above embodiments may also be obtained in this case.

The method for converting the cross-sectional position coordinates described in the above embodiments is an example, and other well-known conventional conversion methods can of course be applied. In this case as well, effects similar to those in the above embodiments can be obtained.

Further, in each of the above embodiments, description has been given of a case in which only one display device 18 or screen 26 is used. However, the present invention is not limited thereto. For example, a plurality of display devices 18 or screens 26 can be used. In this case, each of the plurality of display devices 18 or screens 26 displays the cross-sectional image at the position where that display device or screen is located. In this case as well, effects similar to those in the above embodiments can be obtained.

Further, the configurations of the cross-sectional image display systems 10 and 10' described in the above embodiments (see FIGS. 1 to 3, and 9) are examples, and changes can of course be made as appropriate to the extent that they do not depart from the essence of the present invention.

Moreover, the flow of the processes in the cross-sectional image display processing programs described in the above embodiments (see FIG. 4) is an example, and changes can of course be made as appropriate to the extent that they do not depart from the essence of the present invention.

DESCRIPTION OF REFERENCE NUMERALS

10, 10' cross-sectional image display system
12 personal computer
16 tablet (two-dimensional image presentation unit)
16A position detection surface (presentation surface, detection unit)
18 display device (display unit, designation unit)
18A display surface
18B pen
20A CPU (conversion unit, cross-sectional image creation unit, control unit)
20D secondary storage unit (storage unit)
22 projector (display unit)
26 screen (display unit, designation unit)
26A display surface
26B pen

The invention claimed is:

1. A cross-sectional image display apparatus that displays a cross-sectional image of a three-dimensional image based on three-dimensional image data representing the three-dimensional image, the apparatus comprising:
    a storage unit that pre-stores the three-dimensional image data;
    a display unit for displaying the cross-sectional image;
    a two-dimensional image presentation unit having a presentation surface that presents a two-dimensional image of the three-dimensional image;
    a designation unit for designating a cross-sectional position within the three-dimensional image for the cross-sectional image that is to be displayed, in a state in which the three-dimensional image is virtually constructed in a space above the presentation surface such that the constructed three-dimensional image has dimensions, and is located at a position, corresponding to the two-dimensional image presented at the presentation surface;
    a detection unit that detects the cross-sectional position designated by the designation unit;
    a conversion unit that converts the cross-sectional position detected by the detection unit into a cross-sectional position in a coordinate system of the three-dimensional image;
    a cross-sectional image creation unit that creates cross-sectional image data representing the cross-sectional image of the three-dimensional image at the cross-sectional position converted by the conversion unit based on the cross-sectional position and the three-dimensional image data; and
    a control unit that controls the display unit such that the cross-sectional image data created by the cross-sectional image creation unit is used to display the cross-sectional image.

2. The cross-sectional image display apparatus of claim 1, wherein the two-dimensional image is a plan view or a side view of the three-dimensional image, or a cross-sectional view of the three-dimensional image at a predetermined position.

3. The cross-sectional image display apparatus of claim 1, wherein
    the designation unit is a plate-like object and designates the cross-sectional position by positioning a surface of the plate-like object so as to correspond to the cross-section to be displayed, and
    the cross-sectional image creation unit creates the cross-sectional image data so as to represent the cross-sectional image of an area at which the surface of the designation unit is positioned in the virtually constructed three-dimensional image.

4. The cross-sectional image display apparatus of claim 3, wherein the display unit also serves as the designation unit, and the surface of the plate-like designation unit is a display surface that displays the cross-sectional image.

5. The cross-sectional image display apparatus of claim 1, wherein the display unit uses an image signal produced based on the cross-sectional image data to electrically display the cross-sectional image, or projects light carrying the cross-sectional image represented by the cross-sectional image data to display the cross-sectional image.

6. The cross-sectional image display apparatus of claim 1, wherein
the detection unit is a position detection device that detects the cross-sectional position by detecting a designated position, and
the designation unit is provided with a plurality of fixed pens based on which the position detection device detects the designated position.

7. The cross-sectional image display apparatus of claim 1, wherein the two-dimensional image presentation unit presents the two-dimensional image by using an image signal produced based on the three-dimensional image data to electrically display the two-dimensional image.

8. A cross-sectional image display method for displaying a cross-sectional image of a three-dimensional image based on three-dimensional image data representing the three-dimensional image, the method comprising:
pre-storing the three-dimensional image data in a storage unit;
presenting a two-dimensional image of the three-dimensional image at a predetermined presentation surface;
designating, using a designation unit, a cross-sectional position within the three-dimensional image for the cross-sectional image that is to be displayed, in a state in which the three-dimensional image is virtually constructed in a space above the presentation surface, such that the constructed three-dimensional image has dimensions, and is located at a position, corresponding to the two-dimensional image presented at the presentation surface;
detecting the designated cross-sectional position;
converting the detected cross-sectional position into a cross-sectional position in a coordinate system of the three-dimensional image;
creating cross-sectional image data representing the cross-sectional image of the three-dimensional image at the converted cross-sectional position based on the cross-sectional position and the three-dimensional image data; and
controlling a display unit such that the created cross-sectional image data is used to display the cross-sectional image.

9. The cross-sectional image display method of claim 8, wherein the designation unit is a plate-like object and designates the cross-sectional position by positioning a surface of the plate-like object so as to correspond to the cross-section to be displayed, and
the cross-sectional image data is created so as to represent the cross-sectional image of an area at which the surface of the designation unit is positioned in the virtually constructed three-dimensional image.

10. The cross-sectional image display method of claim 9, wherein the display unit also serves as the designation unit, and the surface of the plate-like designation unit is a display surface that displays the cross-sectional image.

11. A non-transitory, tangible computer readable recording medium storing a cross-sectional image display program executed by a cross-sectional image display apparatus that displays a cross-sectional image of a three-dimensional image based on three-dimensional image data representing the three-dimensional image and comprises a storage unit for pre-storing the three-dimensional image data, a two-dimensional image presentation unit having a presentation surface that presents a two-dimensional image of the three-dimensional image, a designation unit that designates a cross-sectional position within the three-dimensional image for the cross-sectional image that is to be displayed, in a state in which the three-dimensional image is virtually constructed in a space above the presentation surface, such that the constructed three-dimensional image has dimensions, and is located at a position, corresponding to the two-dimensional image presented at the presentation surface, and a detection unit for detecting the cross-sectional position designated by the designation unit, the program causing a computer to execute:
a conversion step of converting the cross-sectional position detected by the detection unit into a cross-sectional position in a coordinate system of the three-dimensional image;
a cross-sectional image creation step of creating cross-sectional image data representing the cross-sectional image of the three-dimensional image at the cross-sectional position converted in the conversion step based on the cross-sectional position and the three-dimensional image data; and
a control step of controlling a display unit such that the cross-sectional image data created in the cross-sectional image creation step is used to display the cross-sectional image.

12. The non-transitory, tangible computer readable recording medium storing the cross-sectional image display program of claim 11,
wherein the designation unit is a plate-like object and designates the cross-sectional position by positioning a surface of the plate-like object so as to correspond to the cross-section to be displayed, and
in the cross-sectional image creation step, the cross-sectional image data is created so as to represent the cross-sectional image of an area at which the surface of the designation unit is positioned in the virtually constructed three-dimensional image.

13. The non-transitory, tangible computer readable recording medium storing the cross-sectional image display program of claim 12,
wherein the display unit also serves as the designation unit, and the surface of the plate-like designation unit is a display surface for displaying the cross-sectional image.

* * * * *